United States Patent [19]
Orzelek et al.

[11] 4,021,289
[45] May 3, 1977

[54] HEAT SEALING DEVICE FOR COMPONENT TAPING APPARATUS

[75] Inventors: Frank J. Orzelek; Roy M. Whiting, both of Binghamton, N.Y.

[73] Assignee: Universal Instruments Corporation, Binghamton, N.Y.

[22] Filed: Aug. 27, 1975

[21] Appl. No.: 608,375

[52] U.S. Cl. .............................. 156/499; 53/198 R; 53/200; 156/552; 156/555; 156/582

[51] Int. Cl.² ...................... B65B 15/04; C09J 5/06

[58] Field of Search .......... 156/552, 582, 562, 321, 156/499, 555, 583; 53/200, 196, 198 R; 209/81 R

[56] References Cited
UNITED STATES PATENTS

| | | | |
|---|---|---|---|
| 2,374,504 | 4/1945 | Salfisberg | 156/552 |
| 3,073,446 | 1/1963 | Wilson et al. | 209/81 R |
| 3,143,454 | 8/1964 | Hannon | 156/499 |
| 3,177,629 | 4/1965 | Anspach | 156/552 |
| 3,484,325 | 12/1969 | Pendleton | 156/582 |
| 3,616,083 | 10/1971 | Mohr | 156/513 |
| 3,616,089 | 10/1971 | Zemek | 156/552 |
| 3,701,233 | 10/1972 | Luckman, Jr. | 53/200 X |
| 3,764,441 | 10/1973 | Bley | 156/552 |

Primary Examiner—Charles E. Van Horn
Assistant Examiner—M. G. Wityshyn
Attorney, Agent, or Firm—Fidelman, Wolffe & Waldron

[57] ABSTRACT

An apparatus for receiving a plurality of electrical components having a body portion and coaxial leads extending in opposite directions therefrom and securing said components in lengths of heat sealed tape on their extremities.

6 Claims, 8 Drawing Figures

HEAT SEALING DEVICE FOR COMPONENT TAPING APPARATUS

BACKGROUND OF THE INVENTION

1. Field of the Invention

This invention relates generally to component tapers and, more specifically, to an apparatus for heat sealing tapes used to hold varied components prior to their insertion in a circuit.

2. Description of the Prior Art

In the electronic component insertion industry, components are packaged in a predetermined order prior to their being loaded into an insertion apparatus. This is done to facilitate shipping, minimize bending and damage and to avoid time-consuming arranging of component sequencing.

Generally, components with oppositely extending coaxial leads are fed into a tapping apparatus in a predetermined order, or fed into a sequencer-taper, and then sealed between two lengths of double-ply tape. The components are spaced so that their lead ends rest on two parallel plies of adhesive tape and then two overlying parallel plies of adhesive tape are pressed onto the first pair of plies, i.e., they are stuck between the sticky sides of the plies.

A problem encountered by using adhesive tape has been the incomplete seal created and limited shelf life. If the components are not used quickly, the plies separate and the leads become loose. One loose component ruins the whole roll of taped components.

The present invention overcomes the problems of adhesive tape systems by using a polyester strip which has an unlimited shelf life, reduces material and operating cost, produces a more stable package and has a high dielectric strength.

Polyester film is non-hygroscopic, resistant to solvents, will not embrittle with age, and is not significantly affected by storage temperatures up to 100° C. The stronger bond between tapes and component-to-tape maintains the accurate component pitch spacing and body centering produced at the pitch wheels. Also, the 4,000 VAC minimum dielectric strength of polyester film permits component testing on tape.

SUMMARY OF THE INVENTION

The present invention is an apparatus which heats the leads of a component to bond them to a first pair of heat sealing tapes and, subsequently, heat seals a second pair of heat sealing tapes to the component leads and the first pair of heat sealing tapes by heated pressure rollers. Temperature sensors are used to monitor the temperature of the lead heating surface and the pressure rollers. The materials of the various elements are chosen to provide efficient heat transfer from the heaters to the heating surfaces, to the sensors, and to thermally insulate the tape transport system from the heating assembly.

OBJECTS OF THE INVENTION

Accordingly, it is an object of this invention to provide an apparatus for heat sealing component leads between tape plies.

It is another object of this invention to provide an apparatus for providing a length of taped components where the tape will maintain the components in place over a long period of time.

A further object of the invention is to provide an apparatus for taping components between two layers of heat sealing tapes.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
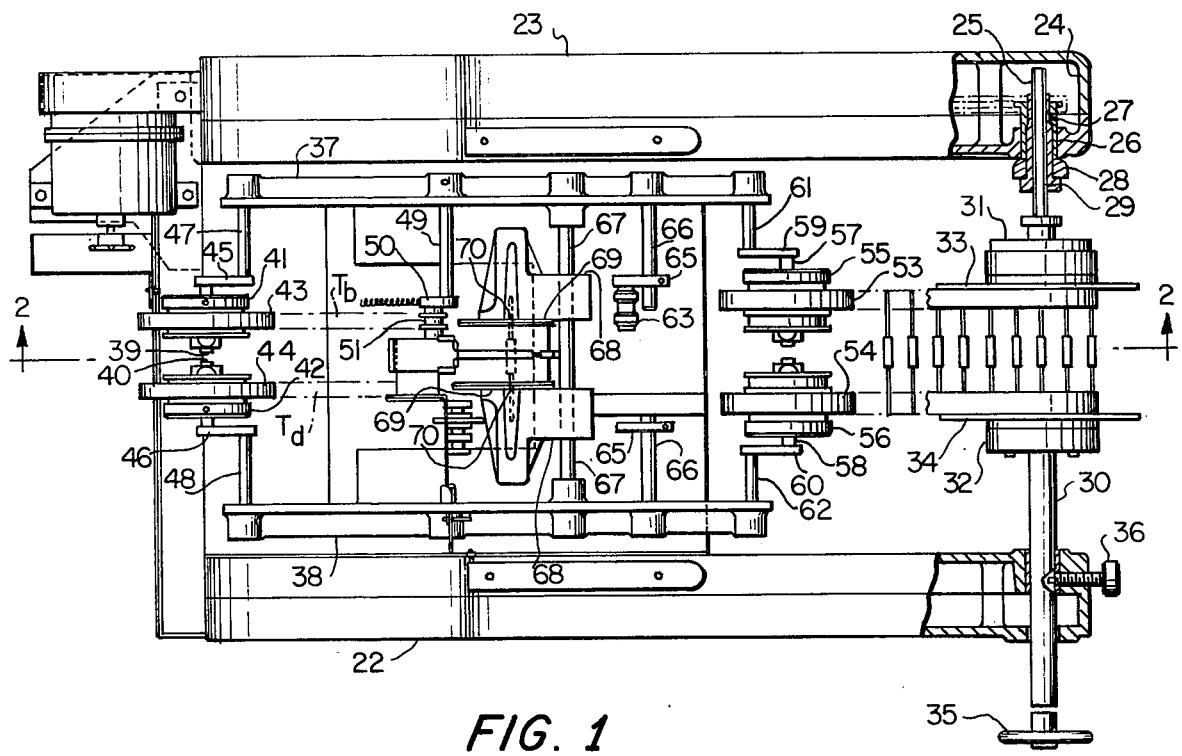
FIG. 1 is a top view of a preferred embodiment of the heat sealing taper of the present invention.
Figure 2:
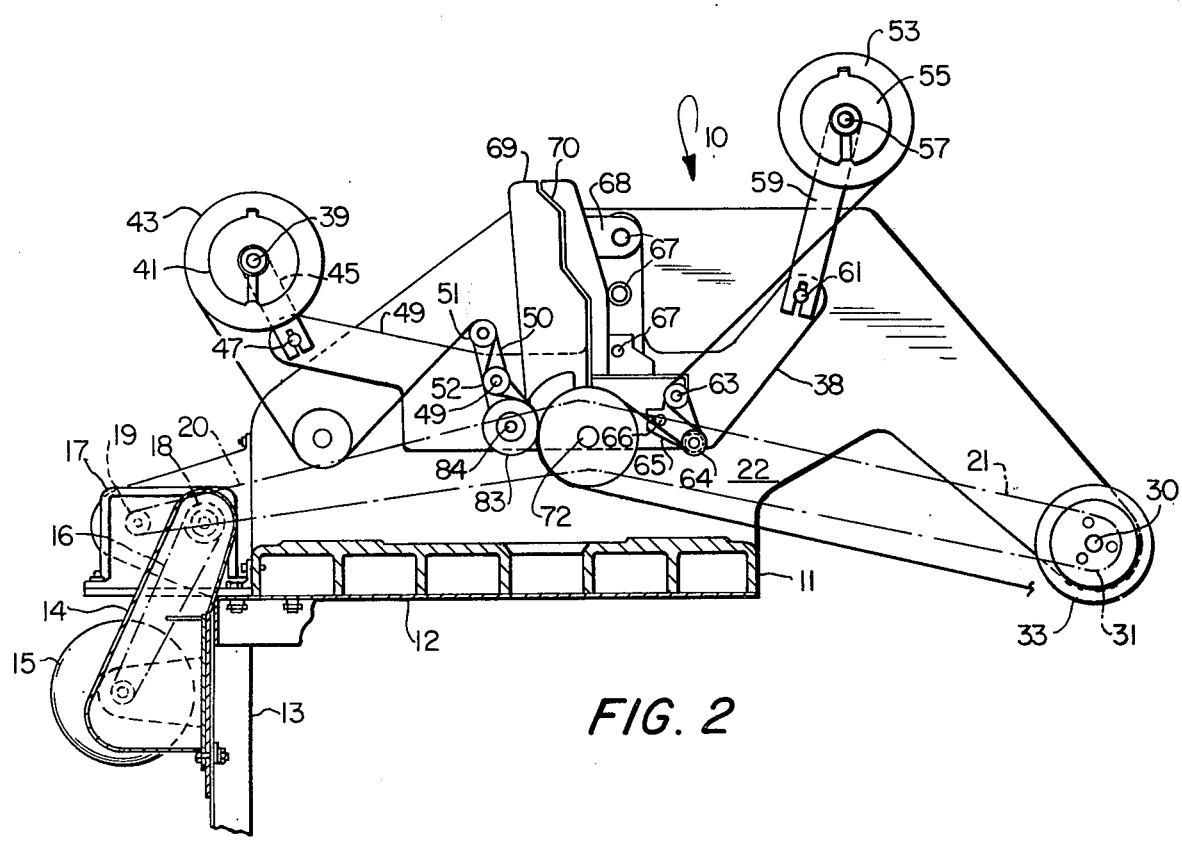
FIG. 2 is a side view taken along lines 2—2 of FIG. 1.

Referring to FIGS. 1 and 2, there is shown the apparatus designated as 10. The apparatus 10 is generally similar to the apparatus described and shown in U.S. Pat. No. 3,073,446 and that patent is hereby incorporated herein by reference.

Generally, the apparatus comprises a main frame 11 supported on table 12 and having support legs such as 13. A housing 14 envelopes a belt drive 16 connected to motor 15. Pulley 18 connects via other belts or drive chains to the various drive shafts in the apparatus. All the gears and drives are contained with side frames 22 and 23 (FIG. 1). Gear 19 is connected via a chain drive 20 to shaft 72 and from shaft 72 to shaft 30 by chain drive 21. As seen in FIG. 2, shaft 72 and shaft 30 are the only driven shafts, the remainder are idler shafts supported in auxiliary frame members 37, 38. As seen in FIG. 1, the inside of side frame 23 is hollow and the end 25 of shaft 30 extends therein. The position of take-up drums 31, 32 with flanges 33, 34 can be adjusted by the manipulation of threaded members 28, 27 in aperture 29. Handle 35 is used to manually advance drums 31, 32 and adjustment screw 36 holds shaft 30 in place.

As seen in FIGS. 1 and 2, tapes $T_a$ and $T_b$ are fed off of front drum 44 having flange 42 on shaft 40 and drum 43 having flange 41 on shafts 39, respectively. Extender arms 45 and 46 connect shafts 39 and 40 to shafts 47 and 48 which are mounted to auxilliary frame members 37 and 38, respectively. The extender arms 45, 46 are used to adapt a standard taping frame for the seven hundred yard long polyester tape drum. The tapes $T_b$ and $T_d$ from drums 43 and 44 are then fed to the heat sealing assembly around small rollers such as 51, 52 on a pair of biased arms such as 50 which are mounted to frame members 37, 38 by shaft 49.

Tape $T_a$ is fed off the rear drum 53 which rotates on the shaft 57 and has a concentric flange 55. Tape $T_c$ is fed off the rear drum 54 which rotates on shaft 58 and has a concentric flange 56. The drums 53, 54 are substantially similar in size and are similarly supported in a parallel, coaxial and symmetrical relationship as clearly illustrated in the top view of FIG. 1. The path of travel of tape $T_a$ leaving the drum 53 is illustrated in the sectional view of FIG. 2. It should be understood that the tape $T_c$ (FIGS. 6, 7) leaving the drum 54 follows a similar path through the mechanism, with always a parallel relationship between the tapes $T_a$, $T_c$. As with the front feeds, extender arms 59 and 60 connect shafts 57 and 58 to shafts 61 and 62, which are mounted to auxilliary frame members 37 and 38, respectively. The tapes $T_a$ and $T_c$ from drums 53 and 54 are then fed to the heat sealing assembly around small rollers such as 63 and 64 on a pair of biased arms 65 mounted to frames 37, 38 by shaft 66.

Mounted on the center of the apparatus above the heat sealing assembly to dowels 67 by supports 68 is a component receiving arrangement having a pair of flanges 69 each with slot 70 therein. The components are loaded into the apparatus with oppositely extending leads $L_1$, $L_2$, being positioned in the slots and the body portion B between the flanges.

Figure 3:
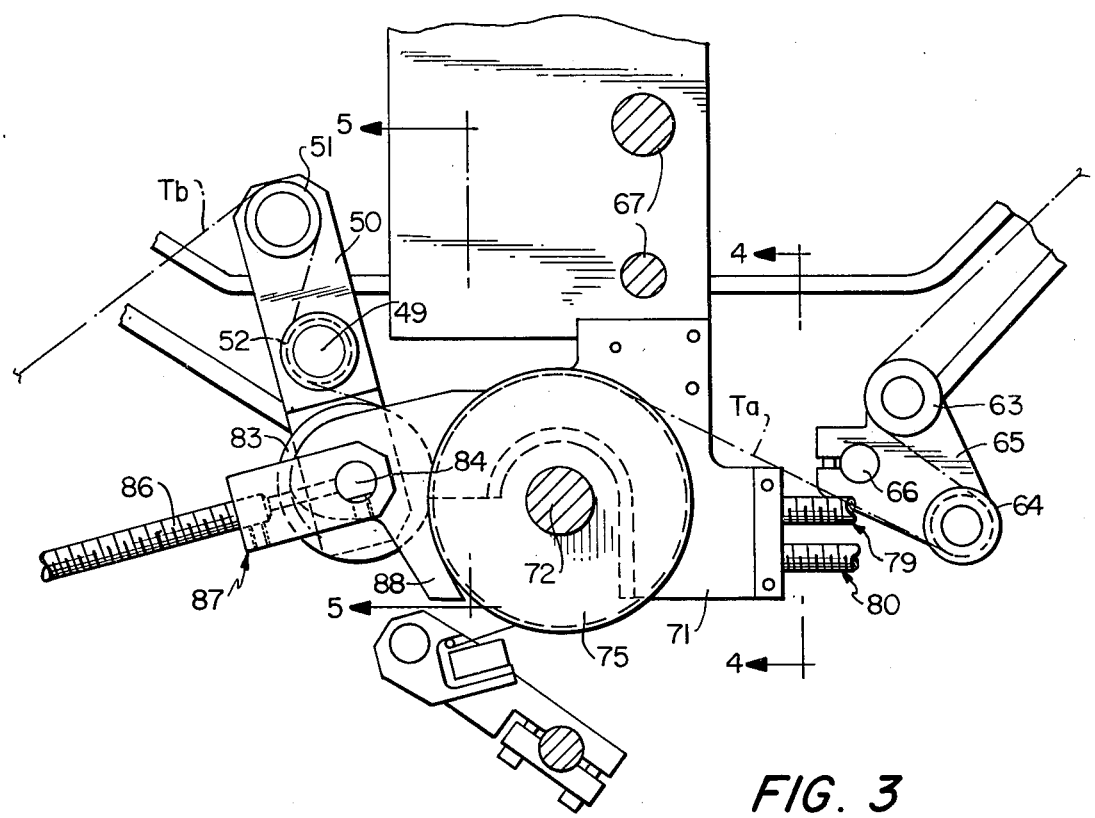
FIG. 3 is a partial side view of the heat sealing assembly of FIG. 2.
Figure 5:
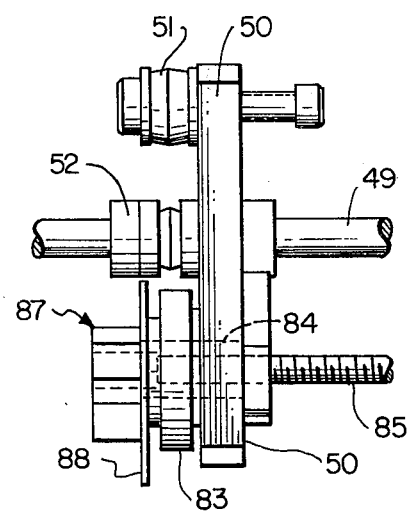
FIG. 5 is a partial view of the top tape heated roller taken along lines 5—5 of FIG. 3.
Figure 4:
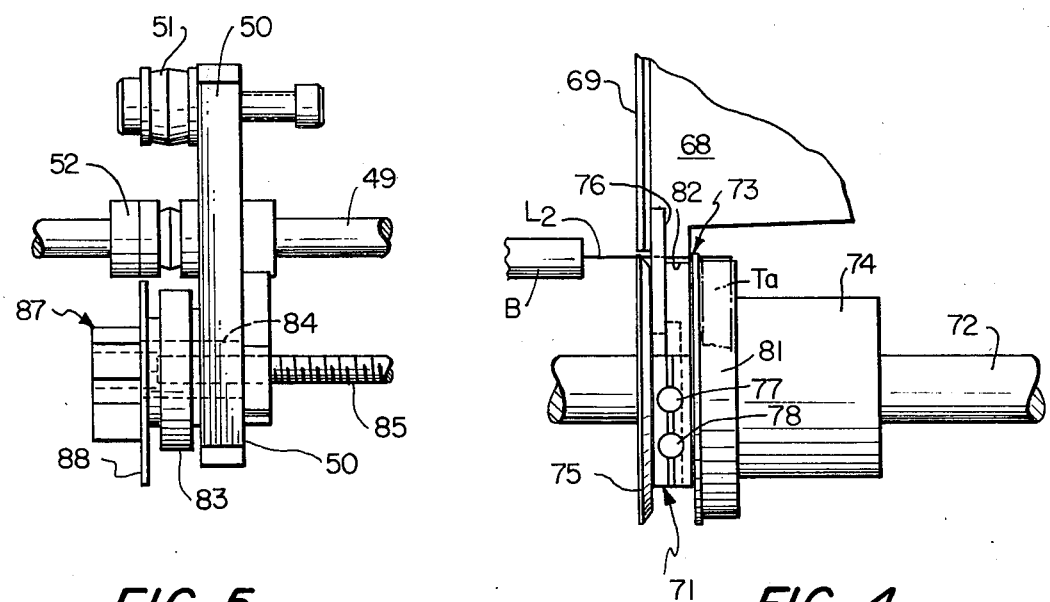
FIG. 4 is a partial view of the indexing, taping and bottom tape heating wheels taken along lines 4—4 of FIG. 3.

The heat sealing assembly, as shown in detail in FIGS. 3–5, includes a heater block 71 surrounding indexing drive shaft 72 between component index wheel 73 mounted to shaft 72 by hub 74 and feed wheel 75. A heat insulating plate 76 is mounted to heater block 71 to isolate block 71 from component receiving support 68. In apertures 77 and 78 of heater block 71 are electrical heater 79 and temperature sensor 80, respectively.

The tapes $T_a$ and $T_c$ from rollers 64 contact surface 81 of hub 74. The leads L of the components exit the bottom of slot 70 onto tapes $T_a$, $T_c$. The components are selectively dropped from the slots by a mechanism forming no part of this invention so as to be equally spaced on tapes $T_a$ and $T_c$. The lead portion between wheels 73 and 75 rides along surface 82 of the heater block 71 whereby the leads are heated. The heat of the leads are sufficient to cause the coating on the polyester film or tape to adhere or bond to the leads. The leads bonded to tapes $T_a$, $T_c$ are rotated into contact with the second pair of tapes $T_b$ and $T_d$.

The other portion of the heat sealing assembly includes a pressure roller 83 mounted to bias arm 50 by shaft 84. Inside shaft 84 is mounted electrical heater 85. Also mounted to shaft 84 is a temperature sensor 86 in a mounting block 87 and a guide 88. Tapes $T_b$ and $T_d$ are fed from roller 52 onto pressure roller 83 and into contact with tapes $T_a$ and $T_c$. The pressure roller 83, heated through shaft 84, heat tapes $T_b$ and $T_d$ and the portions of tapes $T_a$ and $T_c$ not previously heated by the component leads to provide an efficient and effective seal between the tapes $T_a$ and $T_b$, tape $T_c$ and $T_d$, and between tapes $T_b$ and $T_d$ and the component leads. The heat sealed tapes and components are wound on take up drums 31 and 32.

Figure 7:
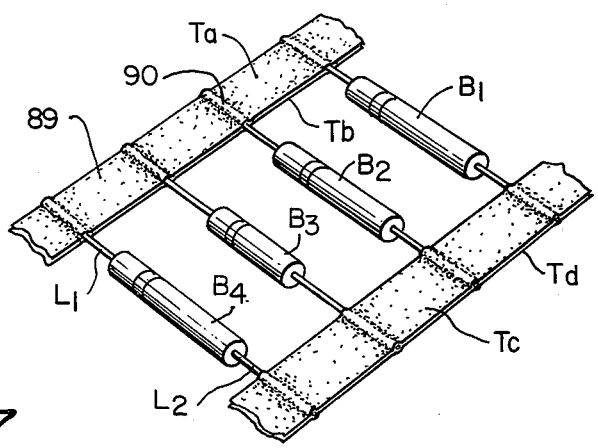
FIG. 7 is a perspective view of a portion of a length of heat sealed taped components.
Figure 6:
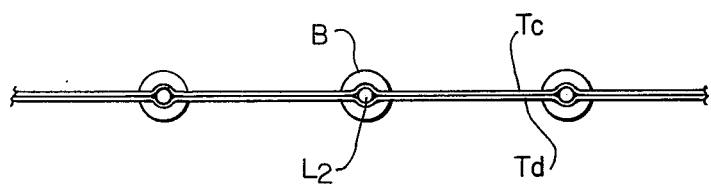
FIG. 6 is a side view of the taped components.

FIG. 6 shows the leads, such as $L_2$, heat sealed between tapes $T_c$ and $T_d$ and FIG. 7 illustrates that components of various size bodies, such as $B_1$–$B_4$ positioned in the tapes. The tapes are heat sealed at 89 and seal the leads as at 90.

Figure 8:
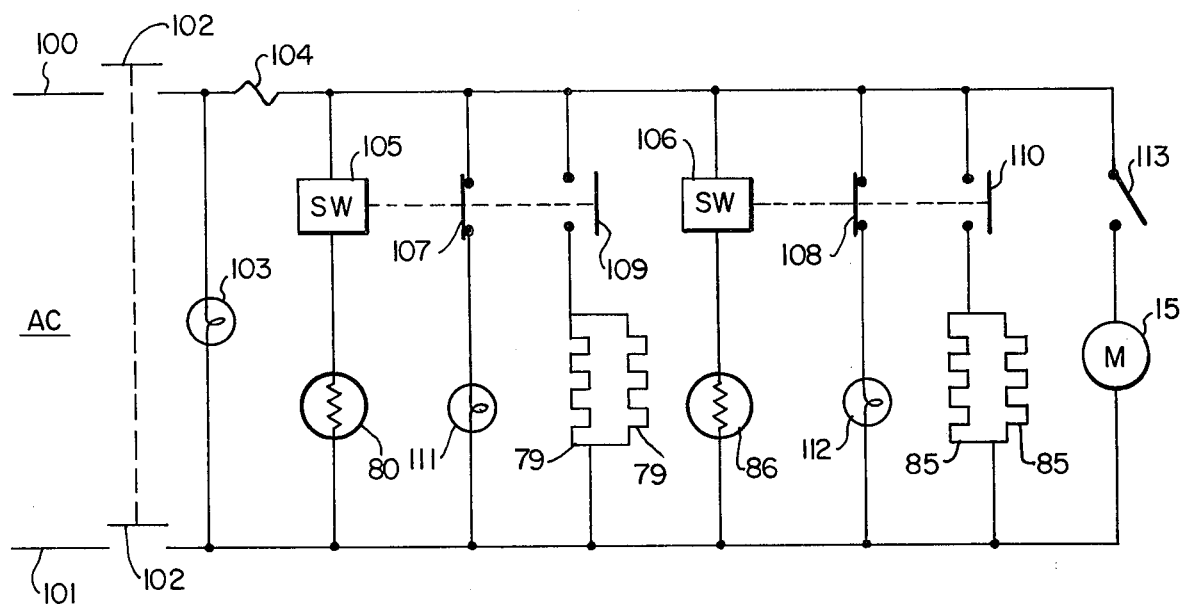
FIG. 8 is an electrical schematic of the control system of the present invention.

The control circuit for the present invention as illustrated in FIG. 8, uses an AC input to lines 100 and 101. A power switch 102 has contact in each line 100, 101, a power on indicator 103 is connected across the lines 100, 101, and a fuze 104 is provided in line 100. Connected across the lines 100, 101 are temperature sensors 80 and 86 from the lead heaters and tape heaters, respectively. Though the sensors are illustrated as thermistors, any other heat sensing element may be used. Temperature sensors 80 and 86 are in series with switches 105 and 106 which control normally closed contacts 107 and 108 and normally open contacts 109 and 110, respectively. The switches 105, 106 are shown as a box and may be any switching system of the prior art which is responsive to a temperature sensor to control a pair of contacts; for example, Serial No. 19-404005-200 by Fenwall of Framingham, Mass. Contacts 107 and 108 are in series with an at temperature indicator 111 and 112, respectively; and contacts 109 and 110 are in series with heating elements 79 and 85, respectively. Motor 15 is in series with an on switch 113 across lines 100, 101.

Upon closing power switch 102, indicator 103 and switches 105 and 106 are activated. Switches 105 and 106 open contacts 107 and 108 and close contacts 109 and 110, respectively. The heating elements 79 and 85 are activated and when they reach the proper temperature, the resistance of thermistors 80 and 86 have changed sufficiently to deactivate switches 105 and 106. This causes contacts 107 and 108 to close, thereby activating at temperature indicators 111 and 112 and causing contacts 109 and 110 to open deactivating heaters 79 and 85. Switches 105 and 106 cycles switches 109 and 110 to maintain the heating assembly at the proper temperature.

Once the operator sees that both at temperature indicators 111 and 112 are on, he closes switch 113 to activate drive motor 15. Switch 113 and motor 15 are just shown schematically and may include speed control, automatic stopping and other well-known control features. Switch 113 may also be a system responsive to indicators 111 and 112 to automatically activate motor 15 when the heaters are at temperature and deactivate motor 15 if the heaters should fail.

The heater and temperature sensor mounts 71 and 87 are made of thermally conductive metals, for example, brass and aluminum. The thermal insulator 76 may be of mica and biased arms 50 should be of a thermally insulative material so as to prevent heat from being transmitted to the tapes $T_b$ and $T_d$ before they reach pressure roller 83. The surface of pressure roller 83 and surface 81 of hub 74 are covered with a silicone rubber. A suggested heat sealing tape is SCOTCHPAR 908 polyester film available from 3M Company.

The system has performed effectively with the pressure roller 83 having a temperature of 190° F ± 5° and surface 81 of heating block 71 at 320° F ± 10°. These temperatures are a function of indexing rate, lead thickness and other physical parameters.

From the preceding description of the preferred embodiments, it is evident that the objects of the invention are attained by providing an apparatus which heat seals axial lead components between two pairs of continuous ribbons of tape.

Although the present invention has been described with reference to the particular embodiments therein set forth, it is understood that the present disclosure has been made largely by way of example and that numerous changes in the details of construction may be resorted to without departing from the spirit and scope of the invention.

We claim:
1. In an apparatus for receiving electrical components having coaxially and oppositely extending leads and sealing said leads between two pairs of continuous tapes, having heat activable adhesive surfaces, the improvement comprising:
- a drum means for receiving first and second tapes, one of each of said pairs;
- a supply means adjacent said drum means for sequentially delivering a plurality of component leads onto said first and second tapes;
- a first heating means adjacent said drum means for directly heating said leads on said first and second tapes without applying heat directly to said first and second tapes and heat sealing said leads to said first and second tapes by contact of said heated leads against said heat activable adhesive surfaces; and
- a roller means adjacent said drum means for receiving third and fourth tapes, one of each pair, and sealing said third and fourth tapes to said first and second tapes, respectively.

2. The apparatus of claim 1 wherein said roller means includes a second heating means for heat sealing said third and fourth tapes to said first and second tapes, respectively.

3. The apparatus of claim 2 including a first detector means for sensing the heat produced by said first heating means, a second detector means for sensing the heat produced by said second heating means and indicator means connected to said first and second detector means for indicating when said first and second heater means are at a predetermined temperature.

4. The apparatus of claim 2 wherein said second heater means heats the surface of said roller means.

5. The apparatus of claim 1 wherein said component leads are delivered to said tapes with a part of said leads contacting said tapes, and said first heating means is positioned to heat a part of said leads not contacting said tapes, whereby heat is conducted from said heater means through said lead, to the part of said leads in contact with said tapes.

6. The apparatus of claim 5 wherein said first heater means includes a curved heating surface axially adjacent said drum means to heat said leads as they move around said drum means.

* * * * *